US008138576B2

(12) United States Patent
Ishikawa et al.

(10) Patent No.: US 8,138,576 B2
(45) Date of Patent: Mar. 20, 2012

(54) PRODUCTION METHOD AND PRODUCTION APPARATUS OF TIN OR SOLDER ALLOY FOR ELECTRONIC COMPONENTS, AND SOLDER ALLOY

(75) Inventors: Hisao Ishikawa, Mashiko-machi (JP); Masanori Yokoyama, Mashiko-machi (JP)

(73) Assignee: Nippon Joint Co., Ltd. (JP)

( * ) Notice: Subject to any disclaimer, the term of this patent is extended or adjusted under 35 U.S.C. 154(b) by 0 days.

(21) Appl. No.: 12/600,410

(22) PCT Filed: Apr. 13, 2009

(86) PCT No.: PCT/JP2009/057808
§ 371 (c)(1), (2), (4) Date: Dec. 1, 2010

(87) PCT Pub. No.: WO2010/089905
PCT Pub. Date: Aug. 12, 2010

(65) Prior Publication Data
US 2011/0089567 A1    Apr. 21, 2011

(30) Foreign Application Priority Data
Feb. 9, 2009    (JP) ................................ 2009-049867

(51) Int. Cl.
*H01L 21/44*    (2006.01)
(52) U.S. Cl. ........ 257/612; 438/613; 438/614; 438/615; 438/616; 438/617; 257/E23.03; 257/E23.023; 257/E21.059
(58) Field of Classification Search .................. 438/612, 438/613, 615, 616, 617; 257/E23.03, E23.023, 257/E21.059
See application file for complete search history.

(56) References Cited

FOREIGN PATENT DOCUMENTS

| JP | 50-040103 | 12/1975 |
|----|-----------|---------|
| JP | 05-050286 | 3/1993 |
| JP | 09-094688 | 4/1997 |
| JP | 11-077366 | 3/1999 |
| JP | 2001-237536 | 8/2001 |
| JP | 2002-233994 | 8/2002 |
| JP | 2002-239780 | 8/2002 |
| JP | 2003-334498 | 11/2003 |
| JP | 2005-131703 | 5/2005 |
| JP | 2006-045676 | 2/2006 |

(Continued)

OTHER PUBLICATIONS

R. Aspandiar, "Void in Solder Joints" SMTA Northwest Chapter Meeting (Sep. 21, 2005).

(Continued)

*Primary Examiner* — Bradley K Smith
*Assistant Examiner* — Amar Movva
(74) *Attorney, Agent, or Firm* — Husch Blackwell LLP

(57) ABSTRACT

The invention provides a technique and a device that dramatically improve joint reliability of miniature joints of fine electronic components. According to the invention, when producing a tin or a solder alloy used for electronic components, an ingot of a tin or a solder alloy is heated, melted and delivered to a reactor. Also, a solution containing organic acid having a carboxyl group (—COOH) is delivered to the reactor. After stirring and mixing the two liquids intensively, the mixed liquid is separated into a molten tin or a molten solder alloy liquid and an organic acid solution according to the difference in specific gravity. Then, the respective liquids are circulated to the reactor, and the metal oxides and the impurities existing in the molten tin or the molten solder alloy are removed, and the molten tin or the molten alloy is purified to have oxygen concentration of 5 ppm or less.

10 Claims, 4 Drawing Sheets

FOREIGN PATENT DOCUMENTS

| | | |
|---|---|---|
| JP | 2006-206951 | 8/2006 |
| JP | 2008-272779 | 11/2008 |

OTHER PUBLICATIONS

C. Hillman "Long-term reliability of Pb-free electronics" Electronic Products p. 69 (Sep. 2005).

Mitsuyuki Ban, Yutaka Shimauchi, "Various Techniques for Reliability Estimation and Failure Analysis of Electronic Products and Components" JFE Giho, No. 13, pp. 97-102 (Aug. 2006).

Shinji Ishikawa et al., "Formation of Kirkendall Voids in the Reactive Diffusion between Cu Plate and Lead-Rich Solders," Journal of Japan Institute of Electronics Packaging vol. 9, No. 4 pp. 269-277 (2006) (abstract).

International Search Report mailed Jul. 7, 2009 (English translation).

Written Opinion of International Searching Authority mailed Jul. 7, 2009 (English translation).

Second Embodiment  60 μm

Second Comparative Example  60 μm

60 μ

PRODUCTION METHOD AND PRODUCTION APPARATUS OF TIN OR SOLDER ALLOY FOR ELECTRONIC COMPONENTS, AND SOLDER ALLOY

TECHNICAL FIELD

The present invention relates to a tin or a solder alloy used for electronic components, its production apparatus and production method. The present invention is applied in the field of electronic components, semiconductor apparatuses and electronic apparatuses. In particular, it relates to a formation technology of a miniature, fine, narrow-pitched high density circuit. In addition, the present invention relates to a technology for preventing Kirkendall voids to be formed after a high-temperature exposure and for improving the impact resistance in the semiconductor apparatuses and electronic apparatuses mounting the miniature, fine, narrow-pitched high density circuit.

BACKGROUND ART

In recent years, demands have been increasing for higher reliability and more reduction in size and weight of electronic devices. Electronic components such as transistors, diodes, ICs (Integrated Circuits), resistors, capacitors and connectors as well as electrode pads and leads for mounting boards (interposers and print circuit boards) for mounting the electronic components are becoming finer and provided with narrower pitch spacing than ever.

In particular, solder joints of ICs, BGAs (Ball Grid Arrays), semiconductor apparatuses and electronic apparatuses are facing demands for an extremely high quality reliability, for said electronic components are tin- or solder-jointed to the mounting boards of ICs and BGAs, and electronic circuits in semiconductor apparatuses and electronic apparatuses are formed including CSPs (Chip Size Packages) soldered to the mounting boards with fine and narrow pitch spacing.

In view of the situation, also the tin or the solder alloy used for the tin or solder joints are demanded for more joint strength and high, long-term quality reliability. Particularly, remediation measures for the following problems that have come to the front are strongly demanded: reliability of fine tin or solder joints in keeping with the miniaturization of the junctions; a pad pitch spacing and a lead pitch spacing in electronic elements and electronic components; leakage failures caused by the excess volume of solder and the solder bridges particularly in a circuit pattern with a narrow pitch spacing; thermal fatigue resistance against the heat cycle fatigue due to heat cycle in solder joints caused by energization switching of electronic devices; and impact breaking resistance associated with the Kirkendall voids that are generated often in the vicinity of joint interfaces after a long-time high-temperature exposure (heat aging).

For one thing, it is needles to say that the trends for finer and narrower pitch also exist in solder joints. For example, mass production technology of fine circuits provided with electrode pads and leads up to 80 μm in width and up to 150 μm in pitch is strongly desired. Such a technology has been considered almost impossible in the conventional methods where soldering is performed by soaking in a molten solder liquid.

For another, in recent years, regulations or bans have been enforced on the use of lead because of its hazardous property. Especially, in the field of electronic components, a so-called "lead-free solder" containing no lead has begun to be commonly used in the latter half of 1990s. It has taken the place of the conventional tin-lead type solder since about the time when the RoHS (Restriction of Hazardous Substances) came into force, and has been rapidly put into practical use.

In such circumstances, a lead-free solder alloy of tin/silver/copper type, a solder alloy additionally added with antimony (Japanese Patent Application Publication No. H05-50286 (Japanese Patent No. 3027441)) and a solder alloy made from a solder alloy of tin/silver/copper type added with nickel or germanium (Japanese Patent Application Publication No. H11-77366 (Japanese Patent No. 3296289)) are, among others, widely in practical use. In addition, also in use are various lead-free solder alloys such as a solder alloy of tin/zinc/nickel type and a solder alloy additionally added with silver, copper, bismuth and so on (Japanese Patent Application Publication No. H09-94688 (Japanese Patent No. 3299091)).

On the other hand, in view of the historical achievement, the quality stability and the reliability, a 63 tin/lead solder (a eutectic solder with 63 mass % Sn and 37 mass % Pb) is partly used for joints of electronic components for automobiles and aircrafts as well as semiconductor devices and electronic devices to this day.

However, these actually-used tin or solder alloys generally contain several hundreds ppm of metallic oxide that makes the viscosity relatively high and the solderability relatively low when melted. Therefore, when solder-coating a fine circuit provided with electrode pads and leads up to 80 μm in width and up to 150 μm in pitch or when solder-plating a semiconductor or various fine electronic components such as BGAs or CSPs to mounting boards, the excessive amount of solder forms projections or so-called "excess volume" at the joints (in the form of horns or icicles in extreme cases. Or otherwise, they are adhered in convexed form because of the relatively big surface tension), even if an appropriate flux is used. Then, particularly where the neighboring pitch is narrow, solder bridges are formed toward the neighboring electrode pads or leads, which results in being subject to "leakage failure" problems. Also, unless an appropriate flux is used at the same time, there exist problems of a poor appearance such as partly "incomplete solderings" arising from the bad solderability.

Moreover, the conventional solder generally has relatively low stretchability (ductility) as one of the physical-mechanical characteristics of solder. Thus, after electronic circuits are built into semiconductor apparatuses or electronic apparatuses and repeatedly switched on and off, solder joints are fatigue-broken with time due to the heat cycle of the heat generation and standing to cool, and conduction failures occur. It is widely known that this impairs the connection reliability of miniaturized electronic devices (Japanese Patent Application Publication No. 2001-237536 (Japanese Patent No. 3221670)).

In other words, with the existing solder joint technique that uses a molten solder or that is performed by applying a solder paste and then melting it, quite a number of leakage failures occur due to said "excess solder" (horns or icicles) or solder bridges toward the adjacent leads. (In an electronic device, for example, the whole surface of the mounting board is coated with a protective film except where the electrode pads and the leads are disposed. Then, a metal mask with openings that are cut to match the electrode pads and leads is put on the mounting board, and the solder paste is printed on the electrode pads and the leads to a predetermined thickness by using a roller or a squeegee. After that, the metal mask is taken off, and the predetermined electronic components are automatically mounted on the predetermined positions of the electrode pads and the leads on the mounting board by an automatic surface mount machine or a mounter. By going through a reflow furnace heated to the temperature where the solder paste is melted and soldering is possible, various components are solder-jointed to the mounting board, and thus the electronic device is produced.) In the formation of minimum, narrowest and fine electronic circuit which can avoid the leakage failures and in which fine, narrow-pitched electrode pads and leads are stably solder-coated or solder-jointed, it is generally said that the minimum electrode pads and leads are about 80 μm in width and about 200 μm in pitch.

Therefore, when forming e.g. fine bumps on fine electrode pads of the chips for a CSP, a still finer and narrower-pitched electronic circuit is formed by coating the whole surface with a protective film except where the electrode pads, on which bumps are formed, are disposed, and then electroform gold or solder bumps to a thickness of some tens μm on the metal surface (that is generally Au-flash plated over the underlying Ni plating) of the perforated electrode pad. Likewise, in the case of mounting boards and BGAs, a fine electronic circuit is primarily formed by electroforming a tin or a solder alloy to a thickness of some tens to 100 μm. However, there are drawbacks such as that the gold is very expensive and that the electroformed solder is inefficient because it requires a long time, complex management, and high initial cost.

Furthermore, with the above-mentioned existing solder-coating and solder-jointing technique, it is generally essential to use a flux or a solder paste for the coating or the jointing. As a result, a solvent and a resin content contained in the flux or the solder paste instantaneously evaporate and scatter at the time of solder jointing, and often generate microvoids by partly remaining as microbubbles at the solder interface or within the solder joint. As a result of various technological improvements and innovations, there are methods for eliminating the microvoids nearly completely. However, with the existing solder joint technology, the Kirkendall voids are generated near the joint interface when the spots are exposed to a high temperature by cumulative energization over a long time (generally exposed at 100° C. or a higher temperature: so-called "heat aging"). The Kirkendall voids increase with time, and at an application of an impact force, the joints fracture. This has become a big problem in recent years from the point of view of the reliability of electronic devices (R. Aspandiar, "Void in Solder Joints", SMTA Northwest Chapt. Meeting (Sep. 21, 2005); C. Hillman, "Long-term reliability of Pb-free electronics", Electronic Products, p. 69 (September 2005); Mitsuyuki Ban, Yutaka Shimauchi, "Various Techniques for Reliability Estimation and Failure Analysis of Electronic Products and Components", JFE Giho, No. 13, pp. 97-102 (August 2006); Shinji Ishikawa et al., "Generation of Kirkendall voids at joint between high-temperature solder and Cu board", Journal of Japan Institute of Electronics Packaging, Vol. 9, No. 4, pp. 269-277 (2006)).

During the heat cycle in which high and low temperatures are generated repeatedly, solder joints of an electronic apparatus fatigue-fracture due to the heat stress caused by the temperature difference between the semiconductor device and the printed board. In order to remedy the fatigue failure and the deterioration of the impact resistance attributed to the partial fatigue failure, Japanese Patent Application Publication No. 2002-239780 (Japanese Patent No. 4152596) suggests using a solder alloy that has oxygen concentration in solid solution of 10 ppm or less in a non-oxidizing atmosphere such as argon gas when dissolving and mixing a tin-silver-copper type solder alloy. By way of this, ductility and strength of the solder can be improved by about 10%, and thermal fatigue resistance and the impact resistance (under the condition of simple drop test) at the solder joints can be remedied. However, the solder alloy described in said Japanese Patent Application Publication No. 2002-239780 (Japanese Patent No. 4152596) does not provide sufficient performance in view of much more rigorous impact resistance tests against accelerated gravity often conducted for miniaturized, fine, downsized semiconductor devices and electronic devices in recent years. For example, by means of only the technology of Japanese Patent Application Publication No. 2002-2397810 (Japanese Patent No. 4152596), high-temperature exposure (e.g. accelerated heat aging test in which solder alloy is left for 240 hours in a temperature-controlled bath at 150° C.) results in the generation of many Kirkendall voids near the joint interface, and no sufficient impact resistance against accelerated gravity is obtained.

As explained above, the existing solder has a drawback arising from the restrictions of its solid state ability and the joint technique. That is, when the existing solder is melted and used, an excessive amount of solder forms projections or so-called "excess volumes" at the joints that result in being subject to "leakage failure" problem by forming solder bridges toward the adjacent leads. As a result, the limits of minimization of solder-coated or solder-jointed electrode pads and leads that are formed with existing solder ball or by soaking in the existing molten solder are no more than 80 μm in width and no more than 200 μm in pitch spacing at present. Generally speaking, electronic circuits with miniature fine solder joints having the smaller width and the smaller pitch spacing have not yet been completely put to practical use, except the aforementioned electroformed solder bump. In view of this situation, further minimization of semiconductor devices and electronic devices is hampered.

SUMMARY OF INVENTION

Technical Problem

It is an object of the invention to develop a solder alloy, its production method and its production apparatus that resolve the following problems so that further deduction in size and weight is promoted, and high reliability is secured for semiconductor apparatuses, electronic apparatuses and electronic devices equipped with them. Such problems are: the "over volume" in the conventional solder alloy; the "leakage failure" problem caused by solder bridges toward the adjacent electrode pads or leads; making it possible to manufacture narrow-pitched, miniature fine electronic circuits with electrode pads and leads having a width of 80 μm or less and a pitch spacing of 150 μm or less, which has been impossible with the technique that makes use of the conventional molten solder; preventing the generation of the Kirkendall voids with time at long-term high-temperature exposure and thus dramatically improving the impact resistance under rigorous test conditions.

Solution to Problem

The tin or the solder alloy, its production method and its production apparatus according to the invention are explained as an example with reference to FIG. 1. An ingot of the tin or the solder alloy is heated and melted in the first reservoir 2. The molten tin or the molten solder alloy liquid 3 is then delivered to the independent reactor 1 via the pump 4 and the pipe 5. Meanwhile, the second reservoir 6 heats up a solution containing 1-80 mass % of organic acid having a carboxyl group (—COOH) therein. The organic acid solution 7 with the liquid temperature of 180-300° C. is delivered to the reactor 1 via the pump 8 and the pipe 9. The liquid 3 and the solution 7 are then stirred and mixed intensively for reaction.

After that, the mixed liquid is delivered to the third reservoir 13 through the pipe 12. The mixed liquid is separated into a molten tin or a molten solder alloy liquid 14 and an organic acid solution 17 according to the difference in specific gravity. The liquids 14 and 17 are circulated to the reactor 1 via the pump 15, the pipe (for the molten tin or the molten solder liquid) 16, the pump 18 and the pipe (for the organic acid solution) 19 respectively, and the metal oxides and the impurities existing in the molten tin or the molten solder alloy are removed and defecated. By means of this, the oxygen concentration in the tin or the solder alloy drops off to near-total zero, or not greater than 5 ppm.

To be more detailed, according to the invention, the metal oxides and the impurities contained in the molten solder are removed by making use of a saponification effect of the organic acid having at least a carboxyl group (—COOH), wherein the organic acid is dissolved in an oil-type solvent with the liquid temperature of 180-300° C., and has a stable molecular architecture. Here, in principle, any organic compound having a saponification effect can be used. The examples include organic acids or organic aliphatic acids such as methane acid (formic acid), ethane acid (acetic acid), propionic acid, butyric acid, isobutyric acid, alpha-methyl-beta-oxybutyric acid, valeric acid, isovaleric acid, active valeric acid, pivalic acid (trimethylacetic acid), caproic acid, 2-ethylbutyric acid, caprylic acid, 2-ethylhexane acid, nonane acid, capric acid, undecanoic acid, myristic acid, palmitic acid, margaric acid, stearic acid, oleic acid, linoleic acid, linolenic acid, arachidic acid, arachidonic acid, behenic acid, lignoceric acid, cerinic acid, montanic acid, melissic acid, cyclohexane carboxylic acid, oxalic acid, maloic acid, succinic acid, glutaric acid, ethylmalonic acid, adipic acid, pimelic acid, sebacic acid, cyclopentanedicarboxylic acid, cyclohexanedicarboxylic acid and its isomer, benzoic acid, p-chlorobenzoic acid, toluic acid, phenylacetic acid, phenyl-succinic acid, phthalic acid, isophtalic acid, salicyclic acid, 1,2,4-benzenetricarboxylic acid, alpha-naphthoic acid, beta-naphthoic acid, calcein, cyclopropane dicarboxylic acid, nitrophthalic acid, glycine, asparagine acid, glutamic acid, alanine, phenylalanine, threonine, methionine, lysine, histidine. Chelate compound such as ethylenediaminetetraacetic acid, nitrilotriacetic acid, 1,2-cyclohexane diamine tetraacetic acid, glycol ether diaminetetraacetic acid, diethylanetriamine pentaacetic acid, 1-(2-hydroxy-4-sulfo-1-naphthylazo)-2-hydroxy-3-naphtoic acid and so on can also be used. In order to promote the saponification reactions by intensively stirring and mixing with molten solder, it is preferable to use an organic compound that dissolves in a solvent that can be used at the temperature range of 180-300° C. and is stable so that it does not decompose. The organic compound should also have a big saponification effect. One possibility is to use an organic compound having a low boiling point under a high pressure, however, it is not very preferable for practical purposes. From a point of view of economic efficiency, handleability and saponification effects, saturated fatty acids with carbon number 14-20, or in other words, myristic acid, palmitic acid, stearic acid, oleic acid, linoleic acid and so on are industrially more appropriate. Especially palmitic acid and stearic acid have outstanding effects and suit the purpose of the invention. They are thus of particular benefit.

Speaking of organic fatty acids, the organic fatty acids with carbon number 12 or less are also available. However, they are not very preferably used because of their water-absorbing property and in view of the use at high temperature. Likewise, the organic fatty acids with carbon number 21 or more can also be used, but not preferably, because they have a generally high melting point and a low permeability. In addition, they have low reserve as a resource and difficult handleability. Moreover, the anticorrosive effects of the processed tin or solder alloy are less enough.

It is particularly desirable to use palmitic acid with carbon number 16 and stearic acid with carbon number 18. They are optimum because they are industrially mass-produced and used, and easily obtainable. Then, a solution consisting of 1-80 mass % of at least one of the palmitic acid or the stearic acid and an oil-type solvent stable at the high temperature range of 180-350° C. for the rest is prepared. By soaking the molten tin or the molten solder alloy in the solution with the liquid temperature of 180-300° C. and intensively stirring it, the tiny oxides and impure metals existing in the molten tin or the molten solder alloy are removed. Especially when the oxygen concentration drops off to 5 ppm or less, excellent physical, mechanical and chemical properties are provided compared to the conventional solder with the same metallic composition: In particular, the solder has flexibility that is 1.5 times as good stretchability (ductility) as that of the conventional solder, and is rich in toughness. Moreover, the viscosity when melted decreases by more than about 30% (an obviously discernible "smoother" appearance is obtained compared to that of the conventional tin or solder alloy). The solderability where no flux is used is also dramatically superior. Moreover, the solder alloy has a solidification temperature 20-30° C. below that of the conventional tin or solder alloy. Thus, the solder alloy of the invention has optimal properties for the formation of a miniature fine, narrow-pitched electronic circuit.

Here, it is an indispensable condition that the oxygen concentration is not greater than 5 ppm. However, in their experiments at the moment, the inventors could unfortunately not have prototyped a solder of the same metallic composition as that of the invention having an intermediate oxygen concentration, or an indecisive solder that has an intermediate oxygen concentration of e.g. 10-50 ppm. This results in not being able to clearly conclude the precise critical value of the oxygen concentration of the solder having the above-mentioned properties. Nonetheless, as is obvious from the Tables 1 and 2 as referred to later, at least the solder with the oxygen concentration of 5 ppm or less has been proved to have excellent properties.

When the aforementioned tin or solder alloy of the invention is used in the tin- or solder-coating or the solder-jointing of, for example, a miniature fine, narrow-pitched electronic circuit provided with electrode pads and leads of 20 μm in width and 60 μm in pitch spacing, the solder-coated part and the solder joints do not form an excess volume. Therefore, no leakage failure is caused by the solder bridge toward the adjacent leads (FIGS. 3a and 3c). Thus, it is possible to produce high-density electronic circuits with high joint reliability, and also to produce small sized, lightweight semiconductor apparatuses and electronic apparatuses with high joint reliability and high density are obtained by assembling the high-density electronic circuits.

To the contrary, in the event where the solder-coating or the solder-jointing with the conventional solder having the same metallic composition as the invention is performed under the same condition (a miniature fine, narrow-pitched electronic circuit provided with electrode pads and leads of 20 μm in width and 60 μm in pitch spacing), typical excessive solder and solder bridge are provided (FIG. 3b).

Furthermore, in solder-coating or solder-jointing of semiconductor apparatuses or electronic apparatuses, the electronic components and the mounting boards to be solder-coated or solder-jointed are soaked in a liquid composed of an upper layer of a saturated fatty acid liquid and a lower layer of the molten solder liquid of the invention having the oxygen concentration of 5 ppm or less. The electronic components and the mounting boards are soaked first in the upper layer liquid, then in the lower liquid, and in the upper liquid again. In the semiconductor apparatuses and the electronic apparatuses after going through the process, the probability of generation of the Kirkendall voids at the joint interface is significantly low even after long-time exposure at a high temperature of 120° C. or more (heat aging). Thus, it is recognized that dramatically excellent impact resistance and thermal fatigue resistance in comparison to the conventional solder alloy are obtained.

As to the concentration of the organic compounds that has at least a carboxyl group (—COOH), is dissolved in the oil-type solvent with the liquid temperature of 180-300° C., and has stable molecular architecture, certain effects are expected even at 1 mass % or less. However, such a weak concentration is not very practical for the use in a successive mass process in view of the complexity of complement management. On the other hand, adequate effects are expected at 80 mass % or more, or even at 100 mass % at the extreme, although they are not desirable because of the problems of smoke evolution, ignition and odor. The most preferable and practical concentration is about 10-70 mass %. The liquid temperature depends on the melting point of the molten tin or the molten solder alloy. It is necessary to intensively stir the organic compounds solution that has at least a carboxyl group (—COOH), is dissolved in an oil-type solvent of 180-300° C. and has stable molecular architecture and the molten tin or the molten solder alloy in a higher temperature range than the melting point so that they are brought into contact.

In consideration of the problems of smoke evolution, ignition and odor, and from an energy-saving point of view, the upper temperature limit should be practically and preferably 300° C. or less. To be more precise, the range from around the melting point of the tin or the solder alloy to about 270° C. is more preferable. At least in the third reservoir in FIG. 1, the temperature of the organic compound solution at the contact with the molten tin or the molten solder liquid should be preferably equal to or higher than the temperature of the molten tin or the molten solder liquid.

In addition, as a solvent that is stable in the high temperature region, any of a mineral oil, a plant oil or a synthetic oil can be used as long as the organic compound can be dissolved therein. Considering stability, safety, economic efficiency and handleability, an ester synthetic oil is most appropriate. The purpose and the reason for using a solvent that is stable at high temperature is to secure safety, to make a more consistent stirring and mixing process easier by decreasing, even if only slightly, the viscosity of the liquid, and to inhibit the problems of smoke evolution at high temperature, ignition property and odor of the organic compound. The concentration of the solvent depends on the concentration of the organic compound.

In the method of encouraging saponification by intensively stirring and mixing the solution containing the organic compound and the molten tin or the molten solder alloy liquid, the solutions is heated to a prescribed temperature and the organic compound is intensively stirred and mixed with the liquid for reaction by using a heating device and a stirrer mixer equipped with e.g. a rotatable impeller stir bar made of stainless or a static mixer etc. By means of this, metallic oxides and a slight amount of impurities existing in the molten tin or the molten solder alloy are eliminated, and the liquid is defecated so that the tin or the solder alloy has the oxygen concentration of 5 ppm or less. The use of a stirrer mixer such as a static mixer for the reaction device makes it possible very efficiently and in a relatively short time to make the oxygen concentration 5 ppm or less.

The stirrer of the reactor and the method of stirring have already been described. Or, as shown in FIG. 1, the reactor 1 is provided with the molten tin or the molten solder liquid 3 from the first reservoir 2 via the dedicated pipe 5 connected to the pump 4. Similarly, the reactor 1 is provided with the organic compound solution 7 from the second reservoir 6 via the dedicated pipe 9 connected to the pump 8. The molten tin or the molten solder alloy liquid 3 and the organic compound solution 7 are controlled to be a prescribed temperature, and they are intensively stirred and mixed for reaction by using an impeller stir bar made of stainless, a vibrator or a static mixer 10.

The reaction time differs depending on the liquid measure of the two liquids, the structure of the stirrer and the method of stirring. In case of a batch reaction, it may take from a few minutes up to about 60 minutes. Preferably, when the mixed liquid 11 after reaction is delivered to the third reservoir 13 via the dedicated pipe 12, the liquid 11 is separated into the two liquids according to the difference in specific gravity. As needed, the molten tin or the molten solder alloy liquid 14 of the lower layer is circulated back to the reactor 1 via the pimp 15 and the dedicated pipe 16. Also, the organic compound solution 17 of the upper layer is circulated back to the reactor 1 via pump 18 and the dedicated pipe 19. At the same time, the metallic oxides and the impurities existing in the tin or the solder alloy are eliminated. A successive cyclic purification should be conducted until the oxygen concentration drops off to 5 ppm or less. In this case, it is also possible not to provide the second reservoir and to use the third reservoir to realize the function of the second reservoir.

After the elimination of the metallic oxides and the impurities existing in the tin or solder alloy, the purified tin or solder alloy with the oxygen concentration of 5 ppm or less is taken out from the drain 20 in the bottom of the third reservoir by opening the valve 21. It is e.g. casted into a mold and used as a tin or a solder alloy for electronic components.

Theoretically, all kinds of tin or solder alloy that is usually used for jointing electronic components is applicable to the invention. However, in consideration of environmental problems and the joint reliability, it is preferable to use a tin or a molten lead-free solder alloy consisting mainly of tin and at least one of silver, copper, zinc, bismuth, antimony, nickel and germanium. Particularly desirable is a lead-free solder alloy containing 1-3 mass % of silver, 0.1-1 mass % of copper, 0.001-0.05 mass % of nickel and 0.001-0.02 mass % of germanium.

As validation embodiments for the present invention, a commercially available alloy with an added tin-silver-copper type alloy, nickel and germanium as well as a commercially available alloy with an added tin-zinc type alloy, nickel and silver are poured, soaked, intensively stirred and mixed in ester synthetic oil solution containing the organic compound of the invention at a predetermined concentration, and the effects are studied. In principle, it is inferred that similar effects are obtained by applying the production method and the production apparatus of the invention to other lead-free solder alloys, clean tin and tin-lead type solder alloys than the above two alloys. This is because they also contain oxides such as tin oxide and the impurities that are in common with the embodiment of the invention. It is to be noted that the purified clean tin itself as an industrial material generally contains a tiny amount of metallic oxide with the oxygen concentration of from 80 up to some hundreds ppm. Commercially available clean tin and various solder alloys are made from purified clean tin. Therefore, it is known that there exists similarly a tiny amount of metallic oxides in molecular state or in fine granular state.

Advantageous Effects of Invention

A detailed explanation is provided below particularly about a saturated fatty acid solution with carbon number 12-20 as a representative example of an organic acid solution having a carbonyl group, and a lead-free solder alloy as a representative example of a tin or solder alloy.

In the present invention, a solution at the temperature range of 180° C. (a temperature higher than that where the molten lead-free solder alloy material to be used is not coagulated) up to 300° C. containing 1-80 mass % of a saturated fatty acid solution with carbon number 12-20 and an ester synthesis for the rest is poured into the reactor 1 of FIG. 1 together with the liquid in which a widely-used normal lead-free solder alloy is melted. They are then intensively stirred and mixed, and copper oxide, tin oxide, silver oxide, oxide of other added metal that exist in the molten solder alloy as well as oxidized impurities such as iron, lead, silicon and kalium contained in the molten solder alloy in a tiny amount react with the carbonyl group of the saturated fatty acid so that they are incorporated therein to form a saponification product. The saponification product is then taken from the molten lead-free solder alloy liquid into the saturated fatty acid liquid, eliminated, cleaned and purified. The stirred mixed liquid is poured into the third reservoir 13 and is left. Then the liquid is separated naturally in a short time according to the difference in specific gravity into a lower layer of the purified molten lead-free solder alloy liquid at the bottom of the reservoir and an upper layer of the saturated fatty acid solution containing the metallic oxides and the impurities. The third reservoir 13 can also be realized as the second reservoir 6. In that case, the second reservoir can be omitted.

It has also been realized that miniature fine tin oxide grains with the size of a few tens nano-microns that usually exist scattered in purified raw tin used for a solder alloy for electronic components are eliminated and cleaned at the same time. In addition, given oxygen concentration of 5 ppm or less, the amount of the oxides that nucleate the coagulation becomes as very low as a near-total absence along the temperature dropping of the molten lead-free solder. So the crystallization point and the coagulation point become low as well. Even if some ppm of oxygen concentration remain and crystallize and coagulate in a very tiny amount, the coagulation barely proceeds further at the temperature. The molten lead-free solder alloy is then in supercooled state, and the next coagulation does not start until around the original coagulation point of an anoxic solder. As explained later, it is proven according to the differential thermal analysis method that the temperature at which the coagulation completes is lower by about 20-30° C. than that of a normal lead-free solder with the same metallic compound. Looking at the crystalline structure when coagulated, the main body of the lead-free solder of the invention with the oxygen concentration of 5 ppm or less is in the form of fine granular crystals (FIGS. 2a and 2c), while in the conventional lead-free solder with the same metallic compound, there are a number of relatively big column crystals (FIGS. 2b and 2d), which is a significant difference.

Moreover, the solder alloy of the invention with the oxygen concentration of 5 ppm or less has, when melted, a viscosity that is lower by about 30-40% than that of a normal lead-free solder with the same metallic composition. Therefore, it also has so-called good "dropping off property" when the works are pulled out from the molten solder liquid. Also, it is unlikely to result in excessive volume.

Now, physical, mechanical and chemical properties of the lead-free solder alloy of the invention produced under the above-mentioned condition are studied. As shown in the below embodiments (first through third), the following properties have been found out: compared to the presently wide-used lead-free solder alloys (the first through third comparative examples), the lead-free solder alloy of the invention has 1.5 times better stretchability and break elongation (ductility), which is a notable improvement; the solderability, when jointed without using a flux, is much better and almost incomparable to that of the conventional lead-free solder alloys; the viscosity, when melted, is relatively low, as already described, and thus it is an optimal lead-free solder alloy for solder-covering/solder-jointing of fine parts. In other words, the lead-free solder alloy of the invention does not cause the problems of excessive volume and solder bridges even if the lead width is so small as 20 µm and the adjacent pitch is so minim as 60 µm (examples are shown in FIGS. 3a and 3c). Thus, it does not cause leakage failures to the adjacent electrode pads and leads. In addition, it has excellent fatigue breaking resistance property at miniature solder joints in view of the heat cycle of high and low temperatures. Furthermore, it provides effects to inhibit the generation of Kirkendall voids when exposed at a high temperature for a long time. Therefore, also in the rigorous acceleration impact resistance test, it is realized that the lead-free solder alloy of the invention has much better resistance in comparison to the jointing products using the conventional solder having the same metallic composition (comparative examples) and that the joints by the solder alloy of the invention has good long-term joint reliability.

This makes it possible to solder-coat and solder-joint in ultra-miniature fine circuit having, in extreme cases, the width of 10 µm and the adjacent circuits pitch spacing of 20 µm (which are almost the limits for a micro fine circuit to be produced by using a molten solder) without causing leakage failures due to solder bridges.

Moreover, tin or solder alloy of the invention can be used, for example, in mounting semiconductor chips on interposer or in jointing and mounting semiconductor device or electronic components such as electronic elements onto a mounting board. In that case, the tin or solder alloy of the invention is melted and allocated to a lower layer, and the solution containing the saturated fatty acid is allocated to an upper layer and tin or solder alloy jointing is conducted. The tin or solder alloy of the present invention has a lower viscosity and much better solderability than the conventional tin or solder alloy product in the marketplace. At the same time, it has excellent physical and mechanical properties i.e. excellent ductility and toughness at the joints after coagulation. Furthermore, the generation of the Kirkendall voids with time is significantly few (they occur rarely) even after long-term high-temperature exposure. Thus, semiconductor apparatuses and electronic apparatuses with stable quality and high connection reliability can be obtained. It is therefore recognized that the tin or solder alloy of the present invention is optimal for a tin or solder joint in micro circuits in particular, because when it is used in assembling e.g. surface-mount apparatuses, almost no time degradation appears in the solderability.

In other words, it is recognized that the tin or solder alloy of the invention is revolutionary because of its very excellent long-term connection reliability in terms of causing no problems of excessive solder volume even in a ultra-narrow-pitched printed circuit with leads of 20-50 µm in width and adjacent pitch spacing of 30-60 μm. No leakage failure due to solder bridges toward adjacent electrode pads or leads is seen, and of course no incomplete soldering is seen either. Also, there hardly occur conduction failures of electronic circuits arising from fatigue-breaking of minim solder joints due to the heat cycle of high and low temperatures.

The same effects can be achieved when the tin or solder alloy of the invention with the oxygen concentration of 5 ppm or less is used in the form of powder for tin- or solder-coating and solder-jointing. Similarly, the same effects can be achieved when the tin or solder alloy of the invention is processed and used as a solder paste, or when it is processed to be a solder ball and used for forming bumps of BGA or CSP, because the aforementioned physicality is maintained.

Particularly, the very low viscosity of the tin or solder alloy of the invention, when melted, not only enables the tin- or solder-coating and the tin- or solder-jointing without causing excessive solder volume and solder bridges at fine parts of miniature fine printed circuits, electronic elements and electronic components, but also is suitable for producing highly-precise minim solder balls with high circularity at 80 μm □ or less in diameter. They are used for bumps of BGAs and CSPs.

In addition, by making use of the low viscosity of the tin or solder alloy of the invention when melted, it is possible to easily produce ultra-miniature tin powder or solder alloy powder, a grain of which having a diameter of 10 μm □ or less and being more miniature and having higher circularity than ever.

As explained above, the tin or the solder alloy that is produced with the use of the production method and the production apparatus of the invention is so revolutionary that it easily makes it possible to assemble electronic components, electronic apparatuses and semiconductor apparatuses that drastically improve joint reliability of fine joints of the minim electronic components, to form fine bumps directly on wafers, to produce fine solder balls, solder cream (solder paste) with high reliability, super-minim tin or solder powder with high accuracy and so on, all of which has been unachievable with the conventional tin or solder alloy. Also, the production method and the production apparatus of the tin or the solder alloy of the invention are the optimal and effective production method and production apparatus that are essential for the production of the sophisticated high-quality tin or solder alloy.

BRIEF DESCRIPTION OF DRAWINGS

FIG. 2a corresponds to the first embodiment, FIG. 2b to the first comparative example, FIG. 2c to the second embodiment, and FIG. 2d to the second comparative example.

FIG. 3a is an external zoomed SEM photograph of the second embodiment taken from above; FIG. 3b is an external zoomed SEM photograph of the second comparative example taken also from above, and FIG. 3c is an external zoomed SEM photograph of FIG. 3a taken from obliquely above.

FIG. 4a shows the second embodiment in an ordinary state, FIG. 4b the second comparative example in an ordinary state, FIG. 4c the second embodiment after going through the heat aging process, and FIG. 4d the second comparative example after going through the heat aging process.

REFERENCE SIGNS LIST

1: Reactor, 2: First Reservoir, 3: Molten tin or solder alloy liquid in the first reservoir, 4: Pump for delivering molten tin or solder alloy liquid in the first reservoir, 5: Pipe for delivering molten tin or solder alloy liquid in the first reservoir, 6: Second reservoir, 7: Organic compound solution in the second reservoir, 8: Pump for delivering organic compound solution in the second reservoir, 9: Pipe for delivering organic compound solution in the second reservoir, 10: Stir bar or stirrer of the reactor, 11: Mixed liquid of molten tin or solder alloy liquid and organic compound solution, 12: Pipe for delivering mixed liquid of molten tin or solder alloy liquid and organic compound solution, 13: Third reservoir, 14: Molten tin or solder alloy liquid in the third reservoir, 15: Pump for delivering molten tin or solder alloy liquid in the third reservoir, 16: Pipe for delivering molten tin or solder alloy liquid in the third reservoir, 17: Organic compound solution in the third reservoir, 18: Pump for delivering organic compound solution in the third reservoir, 19: Pipe for delivering organic compound solution in the third reservoir, 20: Drain, 21: Valve, 22: Copper member of electrode pads or leads, 23: Tin or solder alloy layer, 24: $Cu_3Sn$ layer of intermetallic compound (IMC) near the joint interface, 25: $Cu_6Sn_5$ layer of intermetallic compound (IMC) near the joint interface, 26: Kirkendall voids

DESCRIPTION OF EMBODIMENTS

Embodiments and Comparative Examples

First, lead-free solder alloy that is conventionally widely used and in the marketplace and contains 2.5 mass % of silver, 0.5 mass % of copper and tin for the rest is used as a first comparative example for various performance tests under the conditions as described later.

As a second comparative example, lead-free solder alloy that is conventionally widely used and in the marketplace and containing 2.5 mass % of silver, 0.5 mass % of copper, 0.01 mass % of nickel, 0.005 mass % of germanium and tin for the rest is used for various performance tests under the same conditions as those for the first comparative example.

As a third comparative example, tin-zinc-silver type lead-free solder alloy that is conventionally widely used and in the marketplace and containing 8.0 mass % of zinc, 1.0 mass % of silver, 0.05 mass % of nickel and tin for the rest is used for various performance tests under the same conditions as those for the first comparative example.

Figure 1:
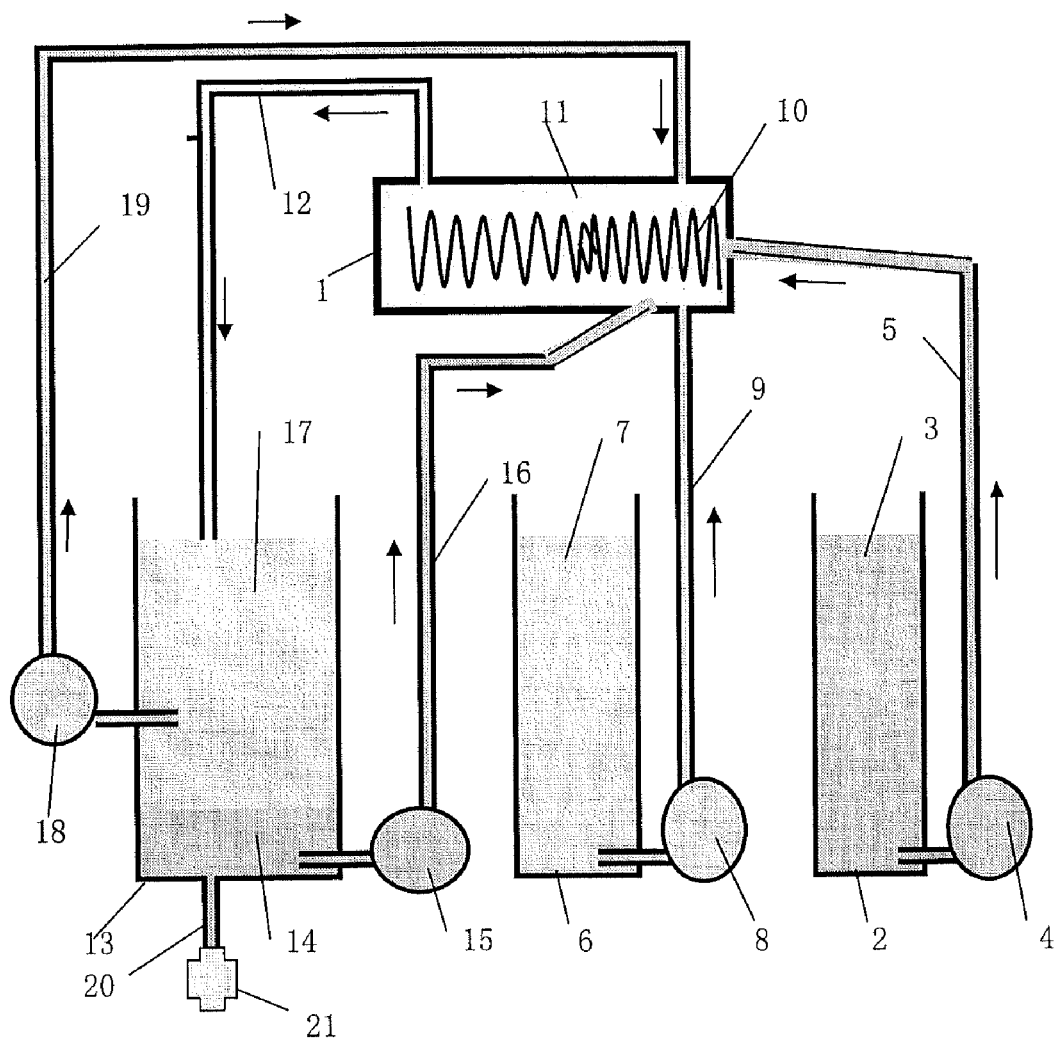
FIG. 1 is a schematic view of an embodiment of a production apparatus of tin or solder alloy of the invention.

Meanwhile, as the first embodiment, a solder alloy of the invention is used for various performance tests under the same conditions as those for the first comparative example. The solder alloy of the present invention is obtained through: melting, in the first reservoir 2 of FIG. 1, a lead-free solder alloy ingot having the same composition as the first comparative example that is commercially available and containing 2.5 mass % of silver, 0.5 mass % of copper and tin for the rest; pouring the molten solder alloy liquid 3 into the reactor 1 which is equipped with a heating device via the pipe 5 dedicated to deliver the liquid and connected to the pump 4, and simultaneously pouring the solution 7 at a liquid temperature of 260° C. containing 10 mass % of palmitic acid and esther synthesis for the rest from the second reservoir 6 into the reactor 1 via the pipe 9 dedicated to deliver the solution and connected to the pump 8; mixing and stirring the two liquids intensively in the reactor 1 for more than 30 seconds for reaction, thereby keeping the liquid temperature being at 260° C.; delivering the mixed liquid 11 to the third reservoir 13 via the dedicated pipe 12, and then separating it into two liquids according to the difference in the specific gravity; circulating for purification for 60 minutes the molten solder liquid 14 of the lower layer and the palmitic acid solution 17 of the upper layer back to the reactor 1 respectively via the pump 15 and the dedicated pipe 16 as well as the pump 18 and the dedicated pipe 19; transferring the purified solder alloy from the slot in the bottom of the third reservoir to a mold, and cooling it down.

As the second embodiment, a solder alloy of the invention is used for various performance tests under the same conditions as those for the first comparative example. The solder alloy of the invention is obtained through: melting, in the first reservoir 2 of FIG. 1, a lead-free solder alloy ingot having the same composition as that of the second comparative example containing 2.5 mass % of silver, 0.5 mass % of copper, 0.01 mass % of nickel, 0.005 mass % of germanium and tin for the rest; pouring the molten solder alloy liquid 3 into the reactor 1 which is equipped with a heating device via the pipe 5 dedicated to deliver the liquid and connected to the pump 4, and simultaneously pouring the solution 7 at a liquid temperature of 270° C. containing 40 mass % of stearic acid and esther synthesis for the rest from the second reservoir 6 into the reactor 1 via the pipe 9 dedicated to deliver the solution and connected to the pump 8; mixing and stirring the two liquids intensively in the reactor 1 for 40 minutes for reaction, thereby keeping the liquid temperature being at 270° C.; delivering the mixed liquid 11 to the third reservoir 13 via the dedicated pipe 12, and then separating it into two liquids according to the difference in the specific gravity; taking the molten solder liquid 14 of the lower layer out from the slot in the bottom of the third reservoir, and transferring the purified solder alloy to a mold, and cooling it down.

As the third embodiment, a solder alloy of the invention is used for various performance tests under the same conditions as those for the first comparative example. The solder alloy of the invention is obtained through: melting, in the first reservoir 2 of FIG. 1, an ingot of the same tin-zinc-silver type solder alloy as the third comparative example commercially available and containing 8.0 mass % of zinc, 1.0 mass % of silver, 0.05 mass % of nickel and tin for the rest; pouring the molten solder alloy liquid 3 into the reactor 1 which is equipped with a heating device via the pipe 5 dedicated to deliver the liquid and connected to the pump 4, and simultaneously poring the solution 7 at a liquid temperature of 270° C. containing 40 mass % of stearic acid and esther synthesis for the rest from the second reservoir 6 into the reactor 1 via the pipe 9 dedicated to deliver the solution and connected to the pump 8; mixing and stirring the two liquids intensively in the reactor 1 for 40 minutes for reaction, thereby keeping the liquid temperature being at 270° C.; delivering the mixed liquid 11 to the third reservoir 13 via the dedicated pipe 12, and then separating it into two liquids according to the difference in the specific gravity; taking the molten solder alloy liquid 14 of the lower layer out from the slot in the bottom of the third reservoir, and transferring the purified solder alloy to a mold, and cooling it down.

The copper concentration and the impurities concentration in the lead-free solder of the respective embodiments and comparative examples are evaluated by measuring the oxygen concentration of the lead-free solder (from the surface to the depth of 10 μm) of the first, second and third embodiments and the first, second and third comparative examples with use of a TOF-SIMS analyzing device.

As to the viscosity, the each solder is melted respectively in alumina crucibles in an argon atmosphere, and cooled down gradually from 300° C. to the coagulation point, and the viscosity is measured with use of an aluminum oscillating-plate viscometer.

As to the solderability, the zero-cross time is measured by means of solderability test according to the meniscograph method, wherein pure copper wires having a diameter of 0.4 mmø are soaked as metering pins in the solder bath in which the solder alloy of the comparative examples and the embodiments are melted separately, thereby keeping automatically the liquid temperature being at 260° C. The test is repeated 4 times (n=4).

As to excessive solder volume (generation of horn or icicle) and solder bridges (leakage), the solder alloy of the comparative examples and embodiments are melted separately and kept automatically at a liquid temperature of 260° C. in the solder bath where ultra-narrow-pitched multilayered printed circuit boards (with four layers) having a thickness of 0.6 mm, a width of 200 mm, a length of 150 mm, a lead-width of 0.02 mm and an adjacent lead spacing of 0.06 mm are soaked for one second. Then the status of solder attach at the leads is observed.

As a physical and mechanical evaluation method, test specimens are prepared from the solder alloy of the comparative examples and the embodiments with use of a casting die (JIS No. 6) made of stainless (SUS 304). Each test specimen has chucking parts having a length (L) of 20 mm and a diameter of 10 mmø at the both ends, and a distance between two evaluation points (L) of 50 mm and a diameter of 8 mmø. The tests are conducted on a tensile testing apparatus (AG100) of Shimadzu Corporation according to the test method of JIS Z 4421 at the room temperature of 25° C., under the loading rate of 5 mm/min. The test is repeated twice (n=2).

In the first, second and third embodiments and the first, second and third comparative examples, BGAs from the same production lot having the size of 15 mm×15 mm×1.2 mm, 192 electrode pads and the lead pitch spacing of 0.8 mm are used as specimens for the voids observation as well as the impact resistance test at the solder joints of the semiconductor devices after the heat aging process. A solder bath is prepared with an upper layer of a solution heated to 240° C. consisting of 50 mass % of palmitic acid and ester synthetic oil for the rest and a lower layer of a molten solder liquid obtained by respectively melting the lead-free solder alloy of the embodiments or the comparative examples. The BGAs are soaked in the upper layer liquid→in the lower layer liquid→in the upper layer liquid in sequence so that their electrode pads are coated with the each solder alloy. Meanwhile, as to the printed circuit boards for burn-in test, a bath is prepared with an upper layer of the solution heated to 240° C. consisting of 50 mass % of palmitic acid and ester synthetic oil for the rest and a lower layer of the molten lead-free solder alloy liquid of the each embodiment or the each comparative example. The BGAs are then soaked in the upper layer liquid→in the lower layer liquid→in the upper layer liquid in sequence so that the copper electrode corresponding to the electrode pads of the BGAs are coated with the solder alloy. Then, the specimens for evaluation tests are obtained by mounting the electrode pads of the solder-coated BGAs of the same kind at the predetermined positions of the electrode pads of the solder-coated printed circuit board in each of the embodiments and the comparative examples.

The reason why the two-layer liquid is used for the processing is that the organic compound solution containing carboxyl group (—COOH) removes the metallic surface oxide film of the electrode pads and leads thorough a saponification reaction to clean and activate the metallic surface as well as to protect the cleaned and activated surface. In addition, providing the structure of the upper and the lower liquid layers brings about the effects that the solder liquid is prevented from directly contacting the air, and that the surface of the solder membrane is coated with an antioxidant chemisorption film when the work is pulled out from the lower layer liquid and goes through the upper layer liquid. Besides, there is a collateral effect of rinsing off the excess solder on the surface of the electrode pads and the leads of the work that have been deposited in the lower layer. These effects, influences and surface process technologies are known from the Japanese Patent Application Publication No. 2003-334498 (Japanese Patent No. 4153723) and the Japanese Patent Application Publication No. 2002-233994 (Japanese Patent No. 4203281).

Now, the printed circuit board for burn-in test is described in more details. A circuit for BGA conduction test is positioned at the center of the board. The circuit as a unit is 77 mm×132 mm in size, 1 mm in thickness and has as many copper leads as and the same pitch spacing as those of a BGA. The copper lead has a diameter of 0.3 mmø. There is disposed another unit each above and below the circuit with spacing of 5 mm so that they form a central column. Similarly, there are disposed two further columns each left and right of the center column with spacing of 5 mm respectively. In other words, a 5×3 matrix of the circuits, or a total of 15 circuits, that can be mounted on the BGAs is obtained. The surface of the printed circuit board is covered with a solder resist film except where the copper electrode pads are. The specimens of the first, second and third embodiments as well as the first, second and third comparative examples are mounted randomly for every unit of a BGA, and used in evaluation tests. The test is repeated five times (n=5).

As a method to evaluate the existence of voids near the solder-joint interface, the specimens are devoted for evaluation in an ordinary state and after going through an accelerated heat aging test in a hemathermal furnace at the temperature of 150° C. for 240 hours. They are polished at the cross-section surface of the solder joint, and the number and the size of microvoids near the solder-joint interface are observed. They are analyzed with use of a scanning electron microscope (SEM) and an x-ray micro analyzer (EPMA). In addition, the specimens of the first, second and third embodiments and the first, second and third comparative examples are conducted an accelerated heat aging test at the same time under the same condition. The specimens are then tested using a commercially available full automatic drop test apparatus for components of electronic devices such as BGAs: according to the JEDEC (Joint Electron Device Engineering Council) standard No. 22-B111: They are dropped repeatedly from the height of 1000 mm with about 1300 G, and checked for conduction. By means of this, the number of the dropping tests carried out before conduction failure is examined (see Table 2).

The results are shown in the below Table 1. There are significant differences in characteristic value between the first embodiment and the first comparative example, between the second embodiment and the second comparative example, and between the third embodiment and the third comparative example. The comparative examples show clearly much worse solderability than the embodiments. As for the physical and mechanical characteristic values, they have small stretchability (ductility) and are rigid and brittle. Also, they have high viscosity when melted. Thus, excess solder volume (horns and icicles), solder bridges (leakage) and incomplete soldering can occasionally be found.

Figure 2A:
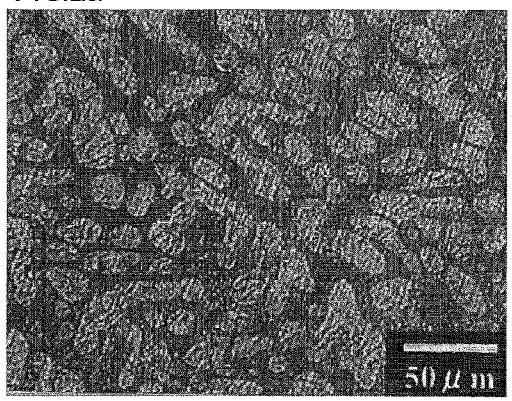
FIGS. 2a-2d show examples of the crystalline structure at the internal section of the solder alloy of the embodiments of the invention and of the comparative examples.
Figure 2B:
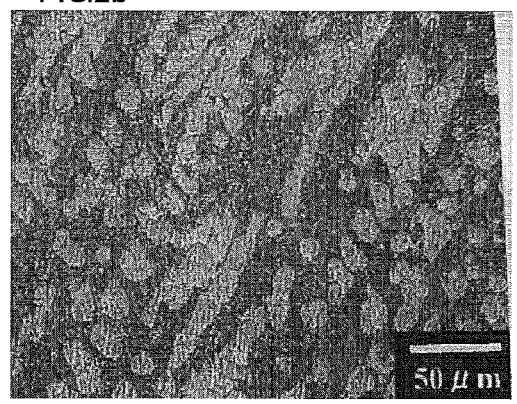
Figure 2C:
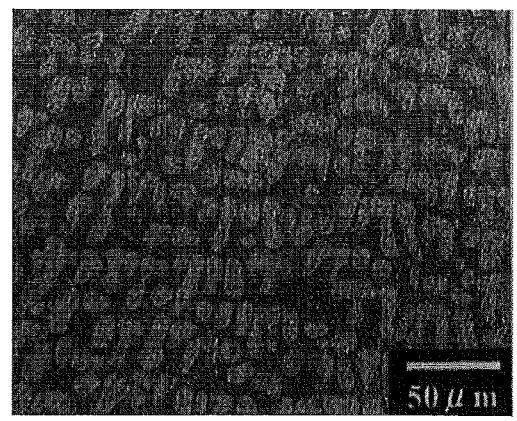
Figure 2D:
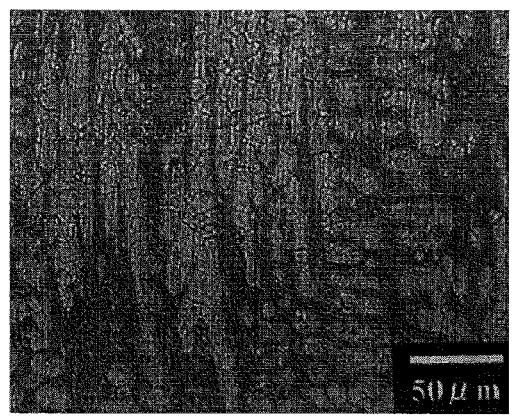
Figure 3A:
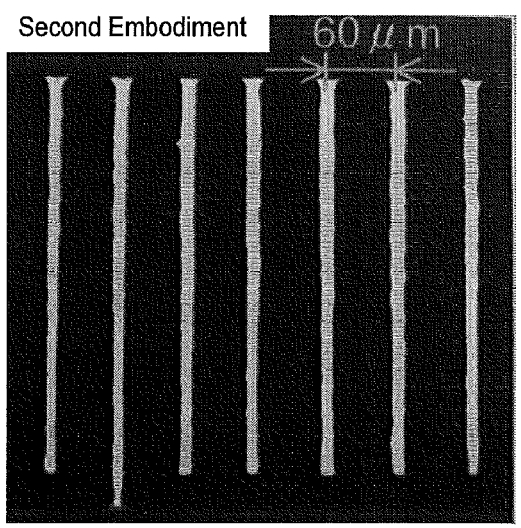
FIGS. 3a-3c are external SEM photographs showing industrially practical applications of a solder coating where the lead-free solder alloy of the second embodiment of the invention and the conventional lead-free solder alloy of the second comparative example are applied to narrow-pitched printed circuit boards with the minim width of 20 μm and the spacing between the adjacent circuits is 60 μm.
Figure 3B:
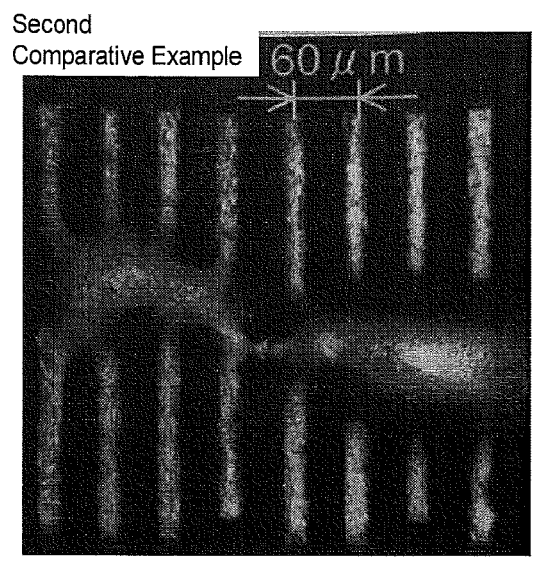
Figure 3C:
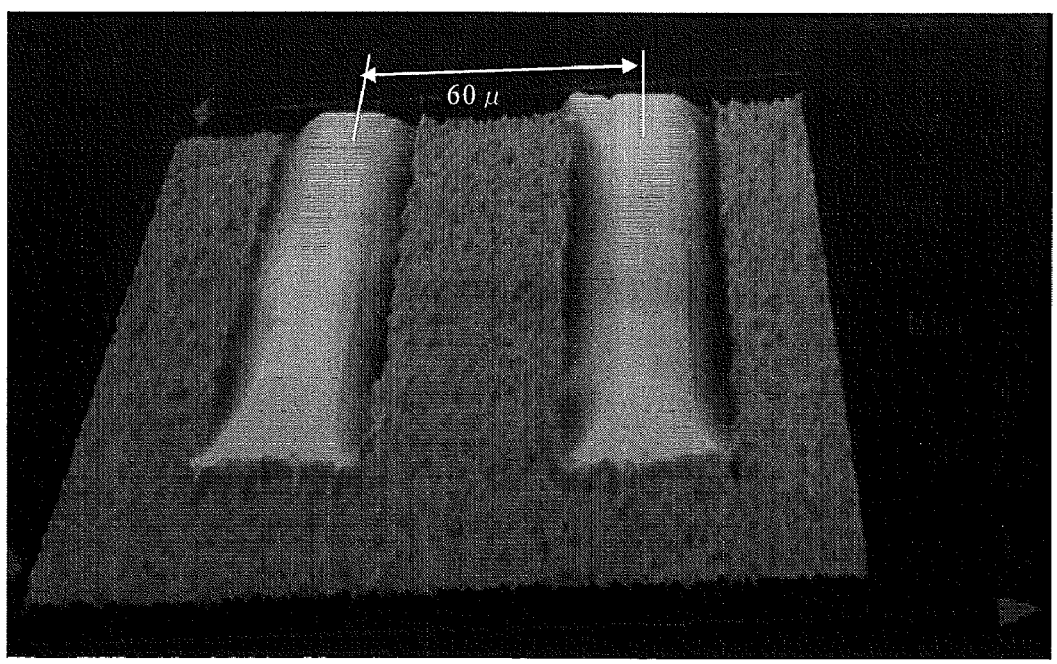

On the other hand, the first, second and third embodiments of the invention show, among others, stretchability which is more than one-and-a-half time bigger than that of the comparative examples, and thus indicate less breaking property. In addition, with respect to solderability, they are predominantly wettable, have predominantly lower stickiness (viscosity) compared to the comparative examples. They have more smooth appearance and lower stickiness than ever. Looking at the crystalline organization in the coagulated solder, the processed solder alloy according to the invention is in the forms of small granular crystals (FIGS. 2a and 2c). In contrast, the commercially available solder alloy having the same composition shows the form of a column crystal, and the grains are bigger and longer (FIGS. 2b and 2d).

Despite the big stretchability, tension strength of the embodiments is not much different from that of the comparative examples. Thus, it is confirmed that the solder alloy of the invention has high toughness and that fatigue breaking due to expansion and contraction in a long-term heat cycle test is less likely to occur.

In addition, it is verified that while the oxygen concentration in the solder of the first, second and third comparative examples is in the range of 70~270 ppm, the oxygen concentration in the solder alloy of the invention is predominantly low and no more than 5 ppm, which is the detection limit of the TOF-SIMS analysis device that is used for the analysis (Table 1).

Similarly, the viscosity is measured for every 5° C. while gradually lowering the temperature from 300° C. to near the coagulation point. As a result, the comparative examples show values of the gradually ascendant viscosity such as 0.0051→0.0061 Pa·S along the temperature fall. The embodiments of the invention also show values of the gradually ascendant viscosity along the temperature fall. However, the values of the relative viscosity, 0.0034→0.0038 Pa·S, are lower than those of the comparative examples by 30~40%. That is, the solder alloy of the invention has significantly low viscosity. It is considered that this improves the "solderability" and makes a great contribution to the prevention of "excess volume solder" and "solder bridges" (Table 1).

Furthermore, according to the results of the analysis with a differential thermal analysis device, the first and the second comparative examples and the first and the second embodiments, which are tin-silver-copper type solder, have almost the same melting point of around 217° C. when elevating temperature. However, as to the coagulation properties when lowering the temperature, while the first and the second comparative examples complete the coagulation at the temperature range of 217~214° C., the first and the second embodiments of the invention start coagulating partly at a temperature range of 218~215° C. Even around 204° C., about only a half of the whole amount coagulates, and the coagulation does not finally complete until around 189° C. Thus, there is clearly a significant physical difference between the first and the second embodiments and the first and the second comparative examples. It is also confirmed that the third embodiment and the third comparative example show much the same pattern (Table 1).

Figure 4A:
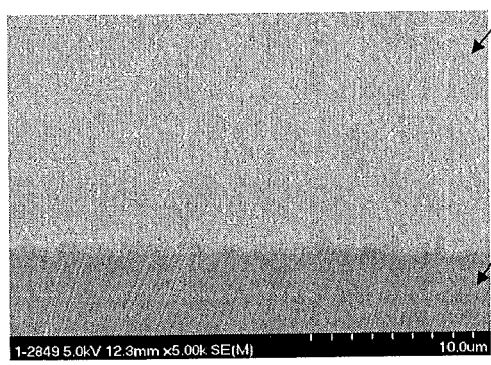
FIGS. 4a-4d are SEM photographs showing cross-sectional views of the solder joints on mounting boards in an ordinary state and after going through the heat aging process at 150° C. for 240 hours in a constant temperature device.
Figure 4B:
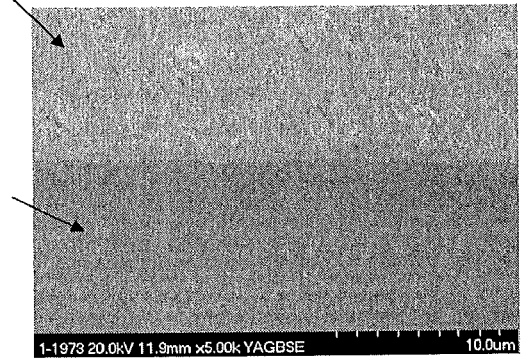
Figure 4C:
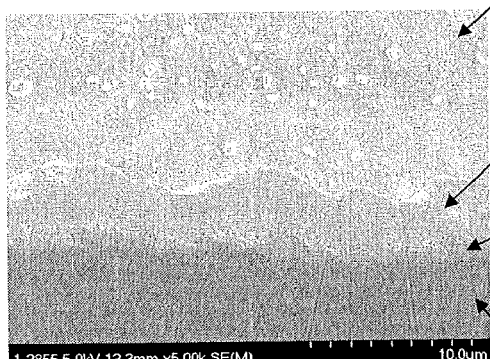
Figure 4D:
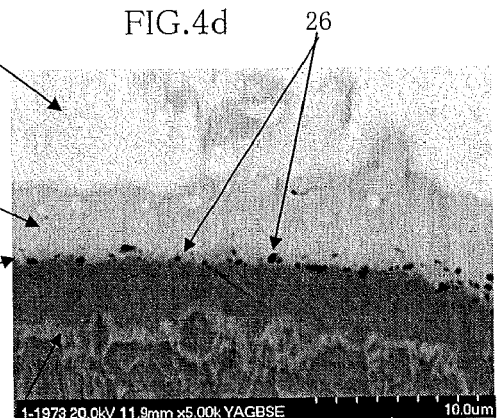

Meanwhile, the generation status of Kirkendall voids after going through a heat aging process is shown in Table 2. In an ordinary state, neither the embodiments nor the comparative examples are indicative of Kirkendall voids and microvoids at all (FIGS. 4a and 4b). However, after the heat aging process, while almost no Kirkendall voids are generated in the first, second and third embodiments (FIG. 4c), the corresponding first, second and third comparative examples have a high incidence of Kirkendall voids (FIG. 4d). (See FIG. 4 and Table 2.)

In addition, the results of impact resistance tests are shown in Table 2. While in the comparative example the conduction failure occurs after 6-14 dropping tests, the first, second and third embodiments do not show the conduction failure at all even after 60 dropping tests. It is to be noted that the impact tests were conducted 60 times and therefore it is unknown to what extent the normality is sustained. From a practical point of view, sufficient reliability is ensured after going through so many dropping tests as 60 times.

alloy as well as solder alloy obtained therethrough to produce electronic components, semiconductor apparatuses and electronic apparatuses with high impact resistance and high reliability. The method, the apparatus and the solder alloy obtained therethrough are industrially more than enough applicable and available in the field of electronic components, semiconductor apparatuses and electronic apparatuses. The solder alloy of the invention is expected to be significantly utilized in further miniature and light-weight semiconductor

TABLE 1

Evaluation Results of Embodiments and Comparative Examples

|  | Maximum Load kN | Tension Strength Mpa | Breaking Elongation mm | Elongation Percentage % | Concentration of Oxygen in Solder ppm | Solderability (zero cross time) seconds | | | Viscosity (300 → 220° C. Temperature fall) Pa/S | Melting Point and Coagulation Temperature ° C. |
|---|---|---|---|---|---|---|---|---|---|---|
| Embodiment 1 | 2.65 | 56.77 | 19.78 | 38.6 | 4, 5 | 0.2 | 0.4 | 0.3 | 0.0033 | Melting Point 217 |
|  | 2.83 | 57.57 | 20.69 | 41.6 |  | 0.2 | 0.3 |  | ↓ | Coagulation Initiation Point 204 |
|  | 2.79 | 56.92 | 21.26 | 40.3 |  | Average: 0.28 | | | 0.0038 | Coagulation Point 189 |
| Embodiment 2 | 2.88 | 57.30 | 18.75 | 37.5 | 1, 1 | 0.2 | 0.3 | 0.3 | 0.0034 | Melting Point 217 |
|  | 2.63 | 52.32 | 18.29 | 36.6 |  | 0.2 | 0.2 |  | ↓ | Coagulation Initiation Point 205 |
|  | 2.70 | 53.72 | 21.26 | 42.5 |  | Average: 0.24 | | | 0.0038 | Coagulation Point 189 |
| Embodiment 3 | 2.84 | 57.70 | 21.15 | 36.8 | 5, 3 | 0.4 | 0.2 | 0.4 | 0.0037 | Melting Point 201 |
|  | 2.83 | 54.32 | 19.47 | 43.7 |  | 0.3 | 0.2 |  | ↓ | Coagulation Initiation Point 190 |
|  | 2.80 | 57.12 | 20.36 | 39.1 |  | Average: 0.30 | | | 0.0040 | Coagulation Point 178 |
| Comparative Example 1 | 2.66 | 57.68 | 11.27 | 23.2 | 200, 85 | 5.8 | 5.8 | 6.4 | 0.0053 | Melting Point 217 |
|  | 2.78 | 56.91 | 12.93 | 24.7 |  | 5.3 | 5.2 |  | ↓ | Coagulation Initiation Point 217 |
|  | 2.97 | 57.62 | 12.59 | 24.6 |  | Average: 5.70 | | | 0.0062 | Coagulation Point 214 |
| Comparative Example 2 | 2.96 | 58.89 | 12.97 | 25.9 | 70, 175 | 5.3 | 5.5 | 5.4 | 0.0051 | Melting Point 217 |
|  | 2.79 | 55.51 | 10.33 | 20.7 |  | 5.3 | 5.5 |  | ↓ | Coagulation Initiation Point 217 |
|  | 2.90 | 57.69 | 12.32 | 24.6 |  | Average: 5.40 | | | 0.0061 | Coagulation Point 214 |
| Comparative Example 3 | 2.86 | 54.66 | 11.15 | 25.9 | 95, 265 | 5.6 | 6.8 | 5.4 | 0.0059 | Melting Point 202 |
|  | 2.89 | 55.41 | 10.37 | 24.1 |  | 6.6 | 5.8 |  | ↓ | Coagulation Initiation Point 200 |
|  | 2.93 | 53.87 | 12.91 | 22.5 |  | Average: 6.20 | | | 0.0070 | Coagulation Point 197 |

TABLE 2

Evaluation Results of Kirkendall Voids Generation and Impact Resistance after Heat Aging Process

|  | Number of Kirkendall voids in the cross section of the joint interface*[1] (Number/0.2 mm) n = 2 | Size of the voids in the cross section of the joint (μ) | Impact resistance Number of dropping tests before conduction failure n = 5 |
|---|---|---|---|
| Embodiment 1 | 9~18 | approx. 0.1~0.4μ | 60 (tests carried out 60 times) |
| Embodiment 2 | 2~6 | approx. 0.1~0.3μ | 60 (tests carried out 60 times) |
| Embodiment 3 | 12~15 | approx. 0.1~0.4μ | 60 (tests carried out 60 times) |
| Comparative Example 1 | approx. 200~300 | approx. 0.1~2μ | 6~11 Average: 8.5 |
| Comparative Example 2 | approx. 150~200 | approx. 0.1~2μ | 8~14 Average: 10.0 |
| Comparative Example 3 | approx. 180~200 | approx. 0.1~1.5μ | 5~11 Average: 8.0 |

*[1]Number and size of the void generations per 0.2 mm in length of cross section of the joint interface

INDUSTRIAL APPLICABILITY

As described above, the technology of the invention provides clearly superior physicality such as high stretchability (ductility), high toughness, low viscosity, coagulation property at a relatively low temperature, high solderability and so on. Such physicality has never been provided by the conventional tin or solder alloy. In particular, no leakage failure occurs due to solder bridges formed at the joint of the circuits having a miniature width and the ultra-narrow-pitched circuit joints. Additionally, deterrent effect on generation of Kirkendall voids after going through the heat aging process is provided. These characteristics make it possible for the production method and the production apparatus of tin or solder alloy as well as solder alloy obtained therethrough to produce electronic components, semiconductor apparatuses and electronic apparatuses in which miniature, fine, narrow-pitched structure is realized.

The invention claimed is:

1. A method for producing a tin or a solder alloy used in coating or jointing of electronic components, comprising the steps of:
    mixing a tin liquid or a solder alloy liquid with an organic acid solution having a carboxyl group (—COOH) for reaction;
    separating the mixed liquid into a tin liquid or a solder alloy liquid and an organic acid solution having a carboxyl group (—COOH) according to the difference in the specific gravity; and removing metallic oxides and impurities exiting in the separated tin liquid or the separated solder alloy liquid, and purifying the tin liquid or the solder alloy liquid to have oxygen concentration of 5 ppm or less.

2. The method as claimed in claim 1, wherein the organic acid solution contains 1-80 mass % of organic acid having a carboxyl group (—COOH) and an oil-type solvent for the rest, and has a liquid temperature of 180-300° C.

3. The method as claimed in claim 1, wherein the organic acid solution contains 3-70 mass % of at least one of palmitic acid or stearic acid and ester synthetic oil for the rest, and has a liquid temperature of 180-300° C.

4. A tin or a solder alloy produced according to the method as claimed in any one of claims 1 to 3.

5. A semiconductor apparatus which semiconductor chip being solder-jointed to an interposer with a tin or solder alloy as claimed in claim 4.

6. An electronic apparatus mounting electronic components and/or semiconductor apparatuses using a tin or a solder alloy as claimed in claim 4.

7. An apparatus for producing a tin or a solder alloy used in coating or jointing of electronic components, comprising:
- a reactor having a heating means and a stirring and mixing means;
- a first reservoir for transferring via a first delivery means a tin liquid or a solder alloy liquid obtained by melting an ingot of a tin or a solder alloy;
- a second reservoir for heating an organic acid solution having a carboxyl group (—COOH) and transferring the organic acid solution to the reactor via a second delivery means;
- a third reservoir for receiving via a third delivery means the mixed solution of the tin liquid or the solder alloy liquid and the organic acid solution having a carboxyl group (—COOH) stirred and mixed in the reactor by the stirring and mixing means, separating the received mixed solution into a tin liquid or a solder alloy liquid and an organic acid solution having a carboxyl group (—COOH) according to the difference in the specific gravity, and circulating the separated tin liquid or the separated solder alloy liquid and the separated organic acid solution having a carboxyl group (—COOH) to the reactor via a fourth delivery means and a fifth delivery means respectively,
- wherein the separated tin liquid or the separated solder alloy liquid is purified through the circulation to have oxygen concentration of 5 ppm or less.

8. An apparatus for producing a tin or a solder alloy used in coating or jointing of electronic components, comprising:
- a reactor for stirring and mixing a tin liquid or a solder alloy liquid and an organic acid solution having a carboxyl group (—COOH) for reaction; and
- a reservoir for receiving via a delivery means the mixed solution that has been reacted in the reactor, separating the received mixed solution into a tin liquid or a solder alloy liquid and an organic acid solution having a carboxyl group (—COOH) according to the difference in the specific gravity, and circulating the separated tin liquid or the separated solder alloy liquid and the separated organic acid solution having a carboxyl group (—COOH) to the reactor via discrete delivery means respectively,
- wherein the separated tin liquid or the separated solder alloy liquid is purified through the circulation to have oxygen concentration of 5 ppm or less.

9. The apparatus as claimed in claim 7 or 8, wherein the organic acid solution contains 1-80 mass % of organic acid having a carboxyl group (—COOH) and an oil-type solvent for the rest, and has a liquid temperature of 180-300° C.

10. The apparatus as claimed in claim 7 or 8, wherein the organic acid solution contains 3-70 mass % of at least one of palmitic acid or stearic acid and ester synthetic oil for the rest, and has a liquid temperature of 180-300° C.

* * * * *